US010911021B2

(12) United States Patent
Turner et al.

(10) Patent No.: US 10,911,021 B2
(45) Date of Patent: Feb. 2, 2021

(54) TRANSVERSELY-EXCITED FILM BULK ACOUSTIC RESONATOR WITH LATERAL ETCH STOP

(71) Applicant: Resonant Inc., Goleta, CA (US)

(72) Inventors: Patrick Turner, San Bruno, CA (US); Carolyn Bianco, San Francisco, CA (US); Charles Chung, San Francisco, CA (US)

(73) Assignee: Resonant Inc., Goleta, CA (US)

( * ) Notice: Subject to any disclaimer, the term of this patent is extended or adjusted under 35 U.S.C. 154(b) by 0 days.

(21) Appl. No.: 16/913,417

(22) Filed: Jun. 26, 2020

(65) Prior Publication Data

US 2020/0412328 A1    Dec. 31, 2020

Related U.S. Application Data

(60) Provisional application No. 62/904,407, filed on Sep. 23, 2019, provisional application No. 62/867,685, filed on Jun. 27, 2019.

(51) Int. Cl.
| | |
|---|---|
| *H03H 9/02* | (2006.01) |
| *H03H 9/17* | (2006.01) |
| *H03H 9/13* | (2006.01) |
| *H01L 41/29* | (2013.01) |
| *H03H 3/02* | (2006.01) |

(52) U.S. Cl.
CPC ............. *H03H 9/17* (2013.01); *H01L 41/29* (2013.01); *H03H 3/02* (2013.01); *H03H 9/02015* (2013.01); *H03H 9/13* (2013.01)

(58) Field of Classification Search
CPC ........ H03H 9/17; H03H 3/02; H03H 9/02015; H03H 9/13; H01L 41/29
See application file for complete search history.

(56) References Cited

U.S. PATENT DOCUMENTS

| | | |
|---|---|---|
| 6,540,827 B1 | 4/2003 | Levy et al. |
| 7,463,118 B2 | 12/2008 | Jacobsen |
| 7,535,152 B2 | 5/2009 | Ogami et al. |

(Continued)

FOREIGN PATENT DOCUMENTS

| | | |
|---|---|---|
| WO | 2016017104 | 2/2016 |
| WO | 2018003273 A1 | 1/2018 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Bryan P Gordon
(74) *Attorney, Agent, or Firm* — SoCal IP Law Group LLP; John E. Gunther

(57) ABSTRACT

Acoustic resonator devices and methods are disclosed. An acoustic resonator device includes a substrate having a front surface and a cavity, a perimeter of the cavity defined by a lateral etch-stop comprising etch-stop material. A back surface of a single-crystal piezoelectric plate is attached to the front surface of the substrate except for a portion of the piezoelectric plate that forms a diaphragm that spans the cavity. An interdigital transducer (IDT) is formed on the front surface of the single-crystal piezoelectric plate such that interleaved fingers of the IDT are disposed on the diaphragm.

18 Claims, 12 Drawing Sheets

(56) References Cited

U.S. PATENT DOCUMENTS

| | | |
|---|---|---|
| 7,684,109 B2 | 3/2010 | Godshalk et al. |
| 7,868,519 B2 | 1/2011 | Umeda |
| 8,278,802 B1 | 10/2012 | Lee et al. |
| 8,829,766 B2 | 9/2014 | Milyutin et al. |
| 8,932,686 B2 | 1/2015 | Hayakawa et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,780,759 B2 | 10/2017 | Kimura et al. |
| 2002/0158714 A1 | 10/2002 | Kaitila et al. |
| 2002/0189062 A1* | 12/2002 | Lin ................ H03H 3/02 29/25.35 |
| 2004/0261250 A1 | 12/2004 | Kadota et al. |
| 2007/0194863 A1* | 8/2007 | Shibata ............. H03H 9/173 333/187 |
| 2008/0246559 A1* | 10/2008 | Ayazi ............... H03H 9/172 333/187 |
| 2011/0109196 A1 | 5/2011 | Goto |
| 2013/0234805 A1 | 9/2013 | Takahashi |
| 2014/0145556 A1 | 5/2014 | Kadota |
| 2014/0151151 A1 | 6/2014 | Reinhardt |
| 2015/0319537 A1 | 11/2015 | Perois et al. |
| 2015/0333730 A1 | 11/2015 | Meltaus |
| 2016/0028367 A1* | 1/2016 | Shealy ............. H03H 9/174 310/321 |
| 2016/0182009 A1 | 6/2016 | Bhattacharjee |
| 2017/0063332 A1 | 3/2017 | Gilbert et al. |
| 2017/0179928 A1 | 6/2017 | Raihn et al. |
| 2017/0214381 A1* | 7/2017 | Bhattacharjee ...... H03H 9/0538 |
| 2017/0214387 A1 | 7/2017 | Burak et al. |
| 2017/0222622 A1 | 8/2017 | Solal et al. |
| 2017/0370791 A1* | 12/2017 | Nakamura ........... H03H 9/145 |
| 2018/0191322 A1* | 7/2018 | Chang ................ H03H 9/132 |
| 2019/0068164 A1 | 2/2019 | Houlden et al. |
| 2019/0131953 A1 | 5/2019 | Gong |
| 2019/0273480 A1 | 9/2019 | Lin |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation $LiNbO_3$ plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium-pp. 2110-2113. (Year: 2003).

* cited by examiner

TRANSVERSELY-EXCITED FILM BULK ACOUSTIC RESONATOR WITH LATERAL ETCH STOP

RELATED APPLICATION INFORMATION

This patent claims priority from the following provisional patent applications: application 62/867,685, filed Jun. 27, 2019, entitled XBAR RESONATOR FABRICATION USING FRONT-SIDE CAVITY ETCH WITH LATERAL ETCH STOP; and application 62/904,407, filed Sep. 23, 2019, entitled XBAR FABRICATION PROCESS. This patent is related to application Ser. No. 16/230,443, filed Dec. 21, 2018, entitled TRANSVERSELY-EXCITED FILM BULK ACOUSTIC RESONATOR, now U.S. Pat. No. 10,491,192.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
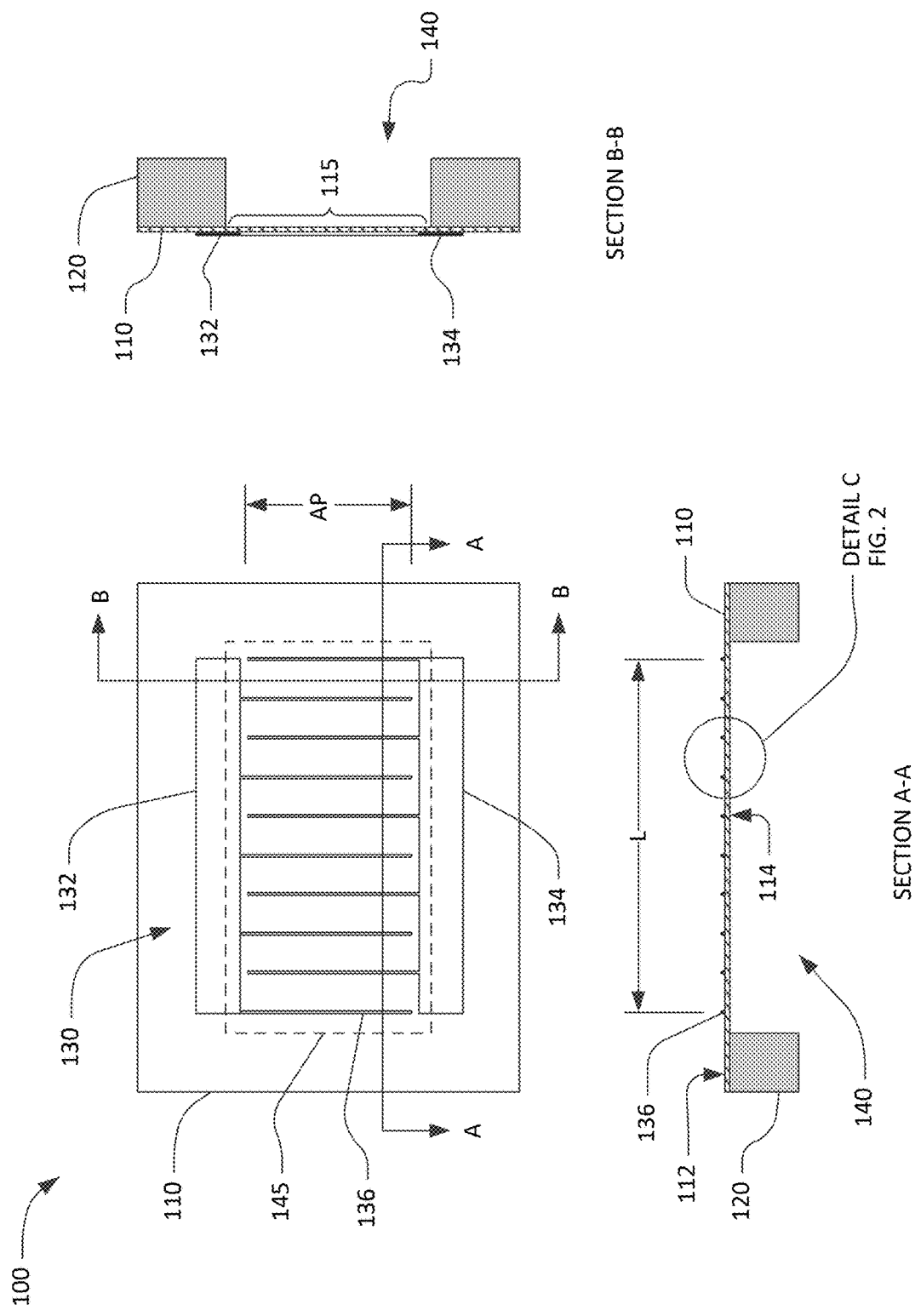
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in U.S. Pat. No. 10,491,192. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. XBARs may be fabricated on piezoelectric plates with various crystallographic orientations including Z-cut, rotated Z-cut and rotated Y-cut.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A, FIG. 3B and FIG. 3C). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
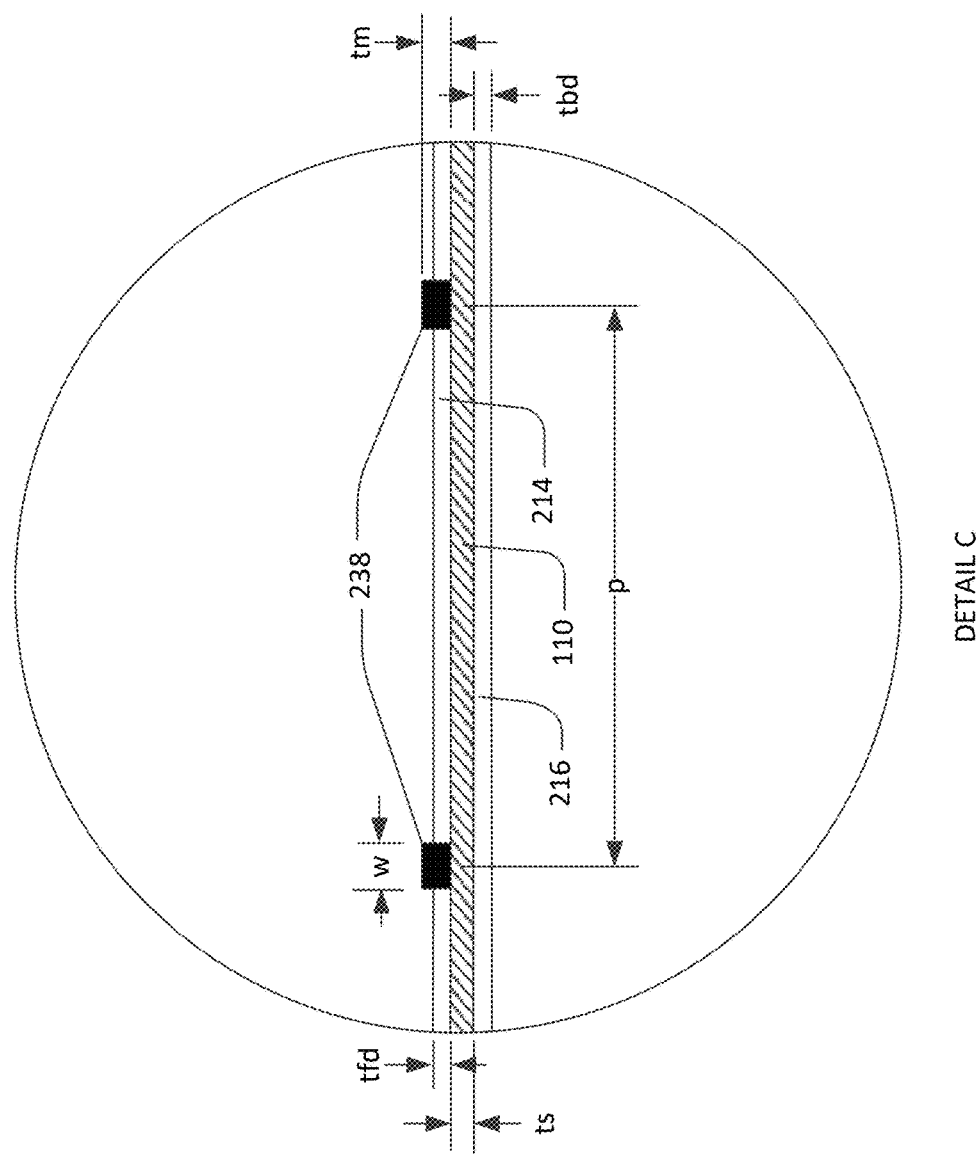
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon oxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum, a substantially aluminum alloys, copper, a substantially copper alloys, tungsten, molybdenum, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
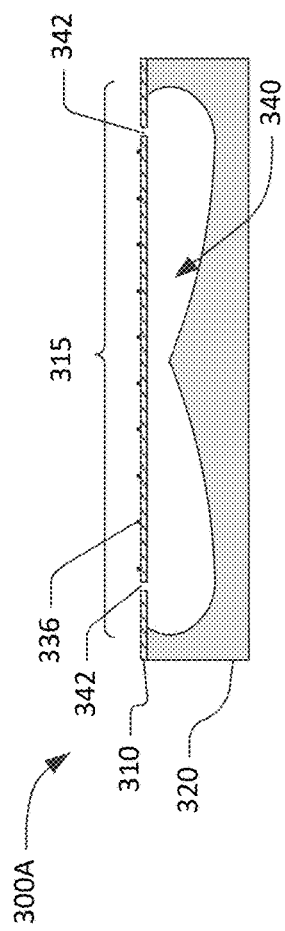
FIG. 3A is an alternative schematic cross-sectional view of an XBAR.
Figure 3B:
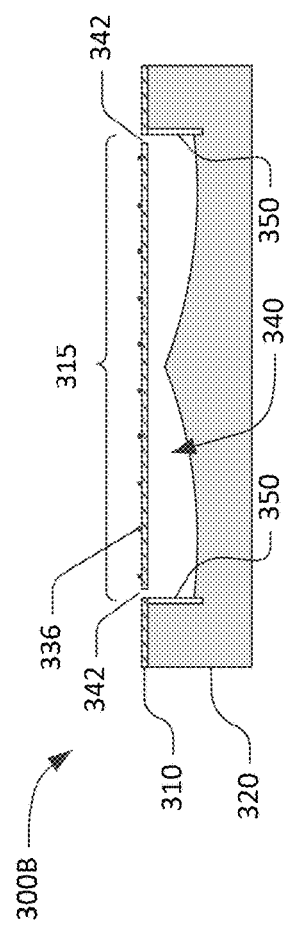
FIG. 3B is another alternative schematic cross-sectional view of an XBAR.
Figure 3C:
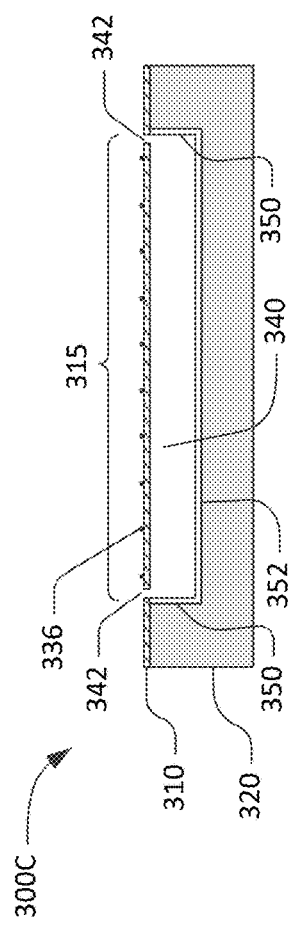
FIG. 3C is another alternative schematic cross-sectional view of an XBAR.

FIG. 3A, FIG. 3B, and FIG. 3C show alternative schematic cross-sectional views along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers, such as finger 336, of an IDT are disposed on the diaphragm 315. The cavity 340 may be formed by etching the substrate 320 with a selective etchant that reaches the substrate through one or more openings 342 provided in the piezoelectric plate 310.

FIG. 3A illustrates problems that occur when the cavity is formed by etching the substrate 320 with a selective etchant that reaches the substrate through the openings 342 in the piezoelectric plate 310. The process used to form the cavity 340 will introduce a liquid or gaseous etchant via the holes 342. This etchant will etch isotropically, causing the cavity to expand in all directions from the holes 342. The resulting cavity will effectively increase the area of the diaphragm 315 beyond the area occupied by the IDT. Resistive and acoustic losses in the IDT generate heat in the diaphragm. Enlarging the diaphragm area beyond the area of the IDT increases the difficulty of removing the heat from the diaphragm. Further, the bottom of the cavity 340 will not be parallel to the piezoelectric plate 310. The deepest portions of the cavity will be proximate the holes 342 and the minimum depth of the cavity will occur near the center of the diaphragm 315.

The shape of the cavity in FIG. 3A is an artistic rendition of the potential problems with etching the cavity 340 with an etchant introduced through holes in the piezoelectric plate 310. The illustrated shape of the cavity is not based on simulation or measurement of an actual etching process.

In FIG. 3B, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers, such as finger 336, of an IDT are disposed on the diaphragm 315. The cavity 340 has been formed by etching the substrate 320 with a selective etchant that reaches the substrate through one or more openings 342 in the piezoelectric plate 310. The lateral extent of the cavity 340 is defined by a lateral etch-stop 350, where "lateral" is defined as any direction parallel the surfaces of the piezoelectric plate 110. While the lateral etch-stop 350 is shown in cross-section in FIG. 3B, it should be understood that the lateral etch-stop 350 is a continuous closed band of etch-stop material that surrounds the cavity 340 such that the lateral etch-stop 350 defines the size of the cavity 340 in the direction normal to the plane of the drawing. In this patent, the term "lateral" encompasses any direction parallel to the surfaces of the substrate and piezoelectric plate.

The lateral etch-stop 350 is formed from an etch-stop material that is substantially impervious to the process and etchant used to form the cavity 340. An etch-stop material is considered "substantially impervious" if the lateral etch-stop fulfills its function of controlling the lateral growth of the cavity. The etch-stop material may not be etched by the process used to form the cavity. or may be etched sufficiently slowly that the lateral etch-stop constrains the lateral extent of the cavity 340. When the substrate 320 is silicon, the etchant may be, for example, $XeF_2$ and the etch-stop material may be, for example, silicon oxide ($SiO_x$), silicon nitride, silicon oxynitride, a metal oxide, a metal nitride, a glass, a ceramic, or a polymer material. Different etch-stop materials and different etchants may be used with different substrate materials. In all cases, the etch-stop material is different from the substrate material.

The lateral etch-stop 350 constrains the growth of the cavity 340 laterally but not vertically. The bottom of the cavity 340 will not be parallel to the piezoelectric plate 310. The deepest portions of the cavity will be proximate the holes 342 and the minimum depth of the cavity will occur near the center of the diaphragm 315.

In FIG. 3C, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers, such as finger 336, of an IDT are disposed on the diaphragm 315. The cavity 340 has been formed by etching the substrate 320 with a selective etchant that reaches the substrate through one or more openings 342 in the piezoelectric plate 310. The lateral (i.e. left-right as shown in the figure) extent of the cavity 340 is defined by a lateral etch-stop 350. While the lateral etch-stop 350 is shown in cross-section in FIG. 3B, it should be understood that the lateral etch-stop 350 is a continuous closed band of etch-stop material that surrounds the cavity 340 such that the lateral etch-stop 350 also defines the size of the cavity 340 in the direction normal to the plane of the drawing. The vertical (i.e. the dimension normal to the surface of the piezoelectric plate 310) extent or depth of the cavity is defined by a vertical etch stop 352. In this case, the cavity 340 has a rectangular, or nearly rectangular, cross section.

The lateral etch-stop 350 and the vertical etch-stop 352 are formed from the same etch-stop material or different etch-stop materials, all of which are substantially impervious to the process and etchant used to form the cavity 340. The lateral etch-stop 350 and the vertical etch-stop 352 may be materials that are not etched by the etch process used to form the cavity, or that are etched sufficiently slowly that the etch-stop constrains the lateral extent of the cavity 340 and the vertical etch-stop 352 defines the depth of the cavity. When the substrate 320 is silicon, the etchant may be, for example, $XeF_2$. The lateral etch-stop 350 and the vertical etch-stop 352 may be, for example, $SiO_2$, $Si_3N_4$, a metal oxide, a metal nitride, a glass, a ceramic, or a polymer material. Different etch-stop materials and different etchants may be used with different substrate materials.

Description of Methods

Figure 4:
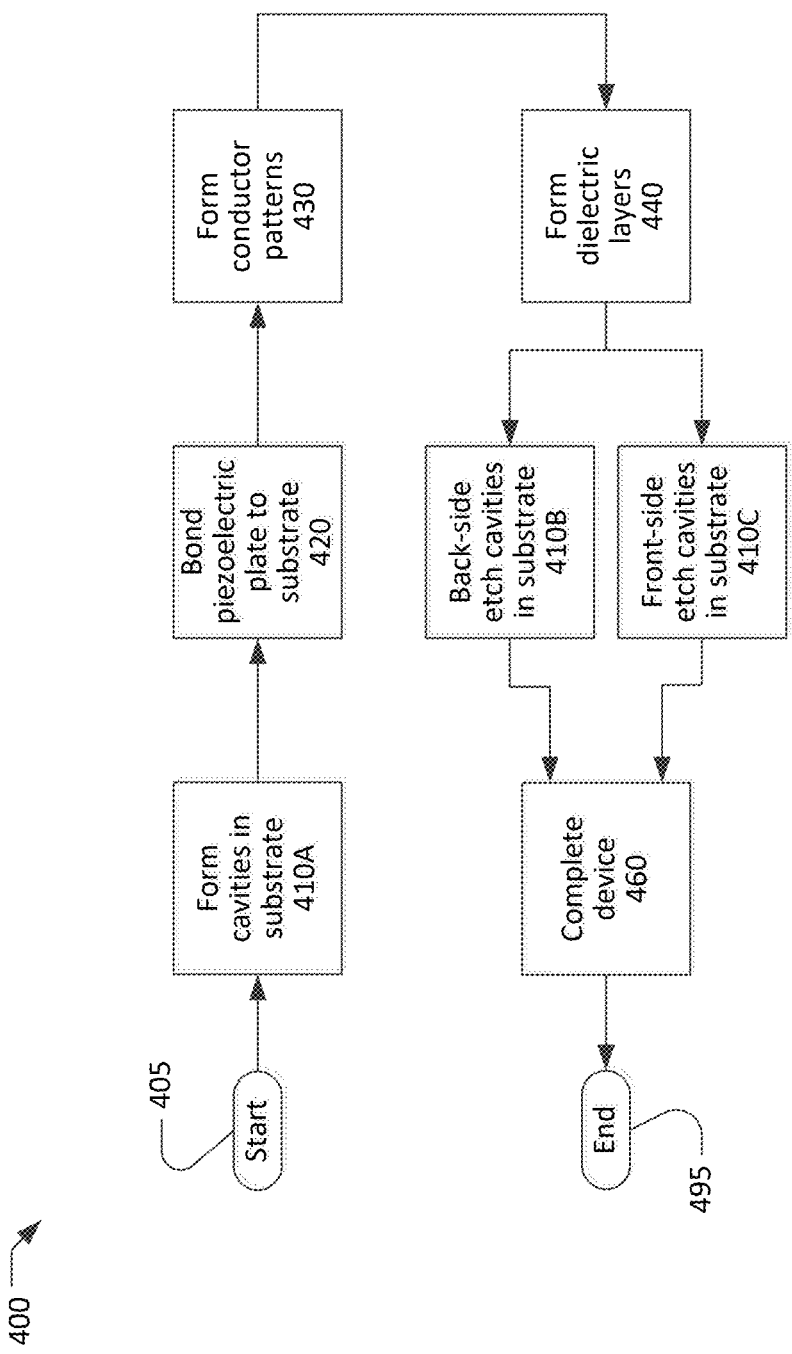
FIG. 4 is a flow chart of a conventional process for fabricating an XBAR.

FIG. 4 is a simplified flow chart showing a process 400 for making an XBAR or a filter incorporating XBARs. The process 400 starts at 405 with a substrate and a plate of piezoelectric material and ends at 495 with a completed XBAR or filter. As will be described subsequently, the piezoelectric plate may be mounted on a sacrificial substrate or may be a portion of wafer of piezoelectric material. The flow chart of FIG. 4 includes only major process steps. Various conventional process steps (e.g. surface preparation, cleaning, inspection, deposition, photolithography, baking, annealing, monitoring, testing, etc.) may be performed before, between, after, and during the steps shown in FIG. 4.

The flow chart of FIG. 4 captures three variations of the process 400 for making an XBAR which differ in when and how cavities are formed in the substrate. The cavities may be formed at steps 410A, 410B, or 410C. Only one of these steps is performed in each of the three variations of the process 400.

The piezoelectric plate may be, for example, Z-cut, rotated Z-cut, or rotated Y-cut lithium niobate or lithium tantalate. The piezoelectric plate may be some other material and/or some other cut. The substrate may be silicon. The substrate may be some other material that allows formation of deep cavities by etching or other processing.

In one variation of the process 400, one or more cavities are formed in the substrate at 410A, before the piezoelectric plate is bonded to the substrate at 420. A separate cavity may be formed for each resonator in a filter device. The one or more cavities may be formed using conventional photolithographic and etching techniques. For example, the cavities may be formed using deep reactive ion etching (DRIE). Typically, the cavities formed at 410A will not penetrate through the substrate, and the resulting cavities will have a cross-section as shown in FIG. 3C (without the lateral or vertical etch-stops 350, 352).

At 420, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or other dielectric, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 420, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 420 starts with a single-crystal piezoelectric wafer. Ions are implanted to a controlled depth beneath a surface of the piezoelectric wafer (not shown in FIG. 4). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 430. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 430 by depositing the conductor layers over the surface of the piezoelectric plate and removing excess metal by etching through patterned photoresist. Alternatively, the conductor patterns may be formed at 430 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern.

At 440, one or more dielectric layers may be formed by depositing one or more layers of dielectric material on the front side of the piezoelectric plate. The dielectric layers may be, for example, silicon dioxide, silicon nitride, or some other material. The dielectric layers may be deposited using conventional techniques such as sputtering or chemical vapor deposition. The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device In a second variation of the process 400, one or more cavities are formed in the back side of the substrate at 410B after all the conductor patterns and dielectric layers are formed at 430. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 400, one or more cavities in the form of recesses in the substrate may be formed at 410C by etching the substrate using an etchant introduced through openings in the piezoelectric plate. A separate cavity may be formed for each resonator in a filter device. The one or more cavities formed at 410C will not penetrate through the substrate, and the resulting resonator devices will have a cross-section as shown in FIG. 3A.

In all variations of the process 400, the filter device is completed at 460. Actions that may occur at 460 include depositing an encapsulation/passivation layer such as silicon oxide, silicon nitride or silicon oxynitride over all or a portion of the device and/or forming bonding pads or solder bumps or other means for making connection between the device and external circuitry if these steps were not performed at 430. Other actions at 460 may include excising individual devices from a wafer containing multiple devices; other packaging steps; and testing. Another action that may occur at 460 is to tune the resonant frequencies of the resonators within the device by adding or removing metal or dielectric material from the front side of the device. After the filter device is completed, the process ends at 495.

Forming the cavities at 410A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 410B requires additional handling inherent in two-sided wafer processing. Forming the cavities from the back side also greatly complicates packaging the XBAR devices since both the front side and the back side of the device must be sealed by the package.

Forming the cavities by etching from the front side at 410C does not require two-sided wafer processing and has the advantage that the XBAR diaphragms are supported during all of the preceding process steps. However, an etching process capable of forming the cavities through openings in the piezoelectric plate will necessarily be isotropic. As illustrated in FIG. 3A, such an etching process will etch laterally (i.e. parallel to the surface of the substrate) as well as etching normal to the surface of the substrate. It may be difficult to control the lateral extent and shape of cavities etched in this manner.

Figure 5A:
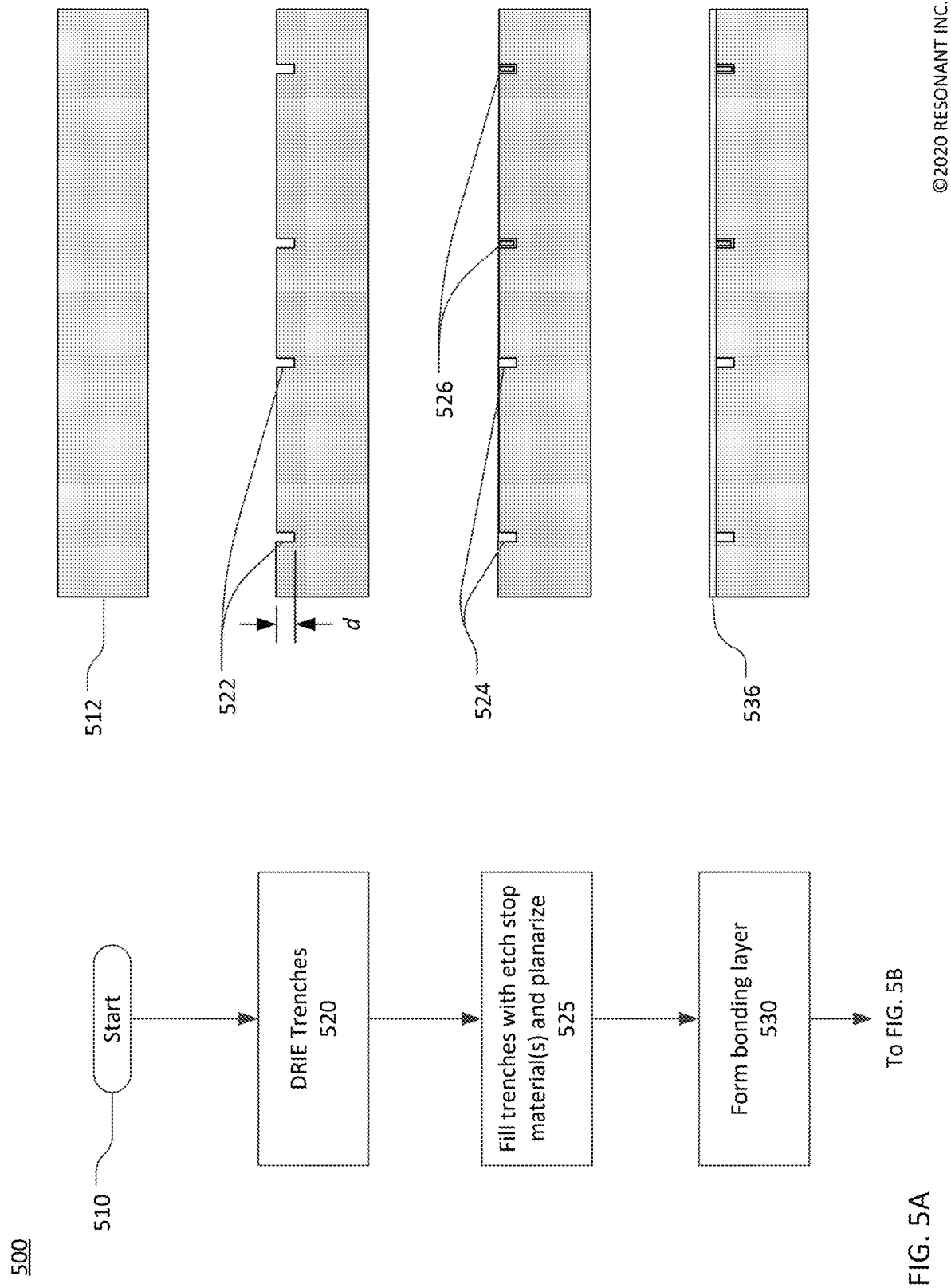
FIG. 5A, FIG. 5B, and FIG. 5C (collectively "FIG. 5") are a flow chart of a process for fabricating an XBAR using a lateral etch stop.
Figure 5B:
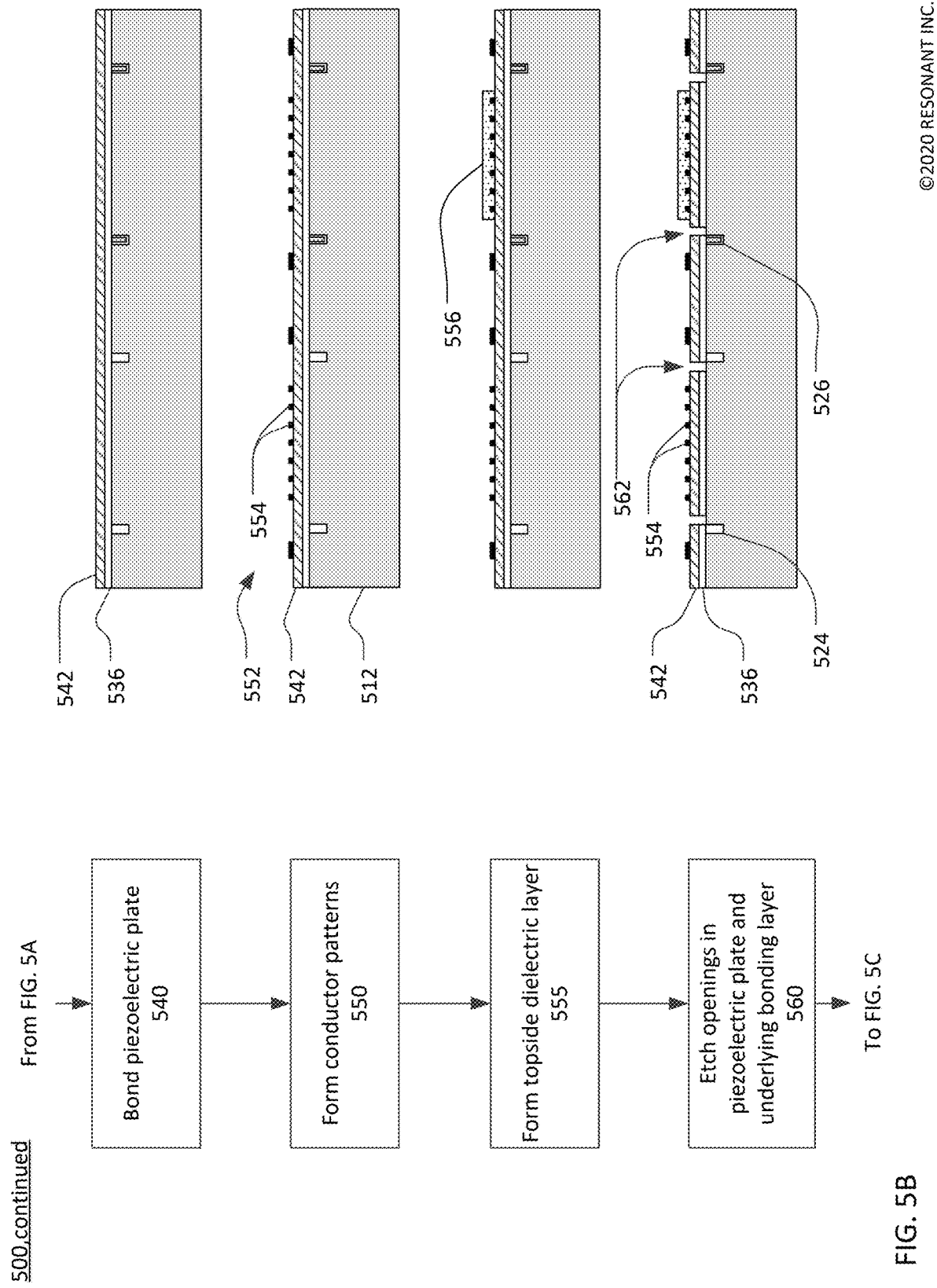
Figure 5C:
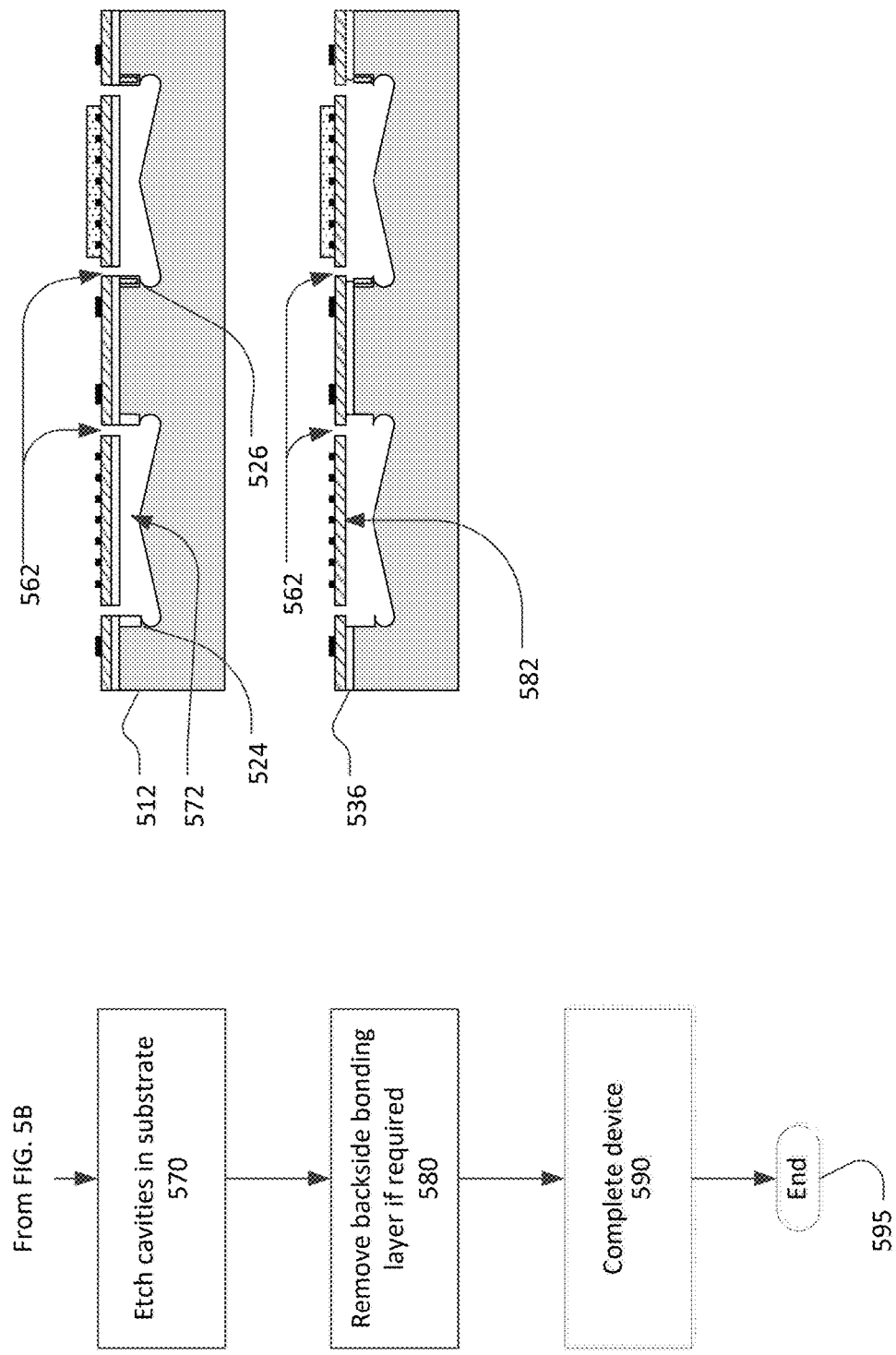

FIG. 5A, FIG. 5B, and FIG. 5C (collectively "FIG. 5") are a simplified flow chart of an improved process 500 for fabricating an XBAR with a lateral etch-stop (for example, lateral etch-stop 350 in FIG. 3B). To the right of each action in the flow chart is a schematic cross-sectional view representing the end of each action. The process 500 starts at 510 in FIG. 5A with a substrate 512 and a plate of piezoelectric material. The piezoelectric plate may be mounted on a sacrificial substrate or may be a portion of wafer of piezoelectric material as previously described. The process 500 ends at 595 in FIG. 5C with a completed resonator or filter device. The flow chart of FIG. 5 includes only major process steps. Various conventional process steps (e.g. surface preparation, cleaning, inspection, deposition, photolithography, baking, annealing, monitoring, testing, etc.) may be performed before, between, after, and during the steps shown in FIG. 5.

At 520, trenches 522 are formed in the substrate 512 in the locations where the lateral etch stop is desired. While the trenches 522 are only shown in cross-section in FIG. 5A, it must be understood that each etch-stop trench is a ring completely around the perimeter of what will become a cavity. The trenches 522 may be formed by etching the substrate through a suitable mask such as a photoresist mask or a hard mask. The trenches may be etched into the substrate using a suitable wet or dry etching process. For example, when the substrate is silicon, the trenches may be formed using deep reactive ion etching (DRIE). Other etching processes may be used on other substrate materials.

The depth d of the trenches 522 may be preferably, but not necessarily, greater than or equal to an intended maximum depth of the cavity adjacent to the etch-stop.

At 525, lateral etch-stops are formed by filling the trenches 522 with one or more etch-stop materials. The etch-stop material or materials may be grown on the substrate and/or deposited onto the substrate using conventional deposition processes such as thermal oxidation, evaporation, sputtering, or chemical vapor deposition. The etch-stop material or materials may be any materials that will function to constrain the lateral growth of the cavity to be etched in the substrate 512. When the substrate 512 is silicon, suitable etch-stop materials include silicon dioxide, silicon nitride, and aluminum oxide.

The lateral etch-stops formed at 520 may be a single material, as shown for lateral etch-stop 524, which may one of the previously described etch-stop materials deposited by a conventional process such as sputtering or chemical vapor deposition. The lateral etch-stops may be two or more materials as shown for lateral etch-stop 526. For example, when the substrate 512 is silicon, a layer of silicon dioxide may first be grown on the surface of the substrate 512 and the interior of the trenches 522. Grown oxide typically has fewer pinholes and other defects than deposited materials. Subsequently, a second material may be deposited over the grown oxide on the surface of the substrate 512 and within the trenches 522. As will be discussed subsequently, there may be some benefit to depositing a material other than silicon dioxide over the grown oxide.

After the trenches 522 are filled with one or more materials to form the lateral etch-stops 524, 526, the surface of the substrate 512 will be uneven and must be planarized. Planarization may be performed by mechanical polishing, by chemo-mechanical polishing, or some other method.

At 530, a bonding layer 536 is formed on the planarized surface of the substrate. The bonding layer may silicon dioxide or some material capable of bonding to the piezoelectric material (typically lithium niobate or lithium tantalate) to be used in the XBAR. The bonding layer may be formed by a conventional process such as evaporation, sputtering, chemical vapor deposition or molecular beam epitaxy.

Referring now to FIG. 5B, at 540, a piezoelectric plate 542 is bonded to the bonding layer 536. Techniques for bonding the piezoelectric plate were previously described for action 420 in the process 400 of FIG. 4. The description of those techniques will not be repeated.

At 550, conductor patterns 552 are formed on the surface of the piezoelectric plate 542. The conductor patterns include IDT fingers 554 disposed on portions of the piezoelectric plate 542 where cavities will be formed in the substrate. The structure of and techniques for forming the conductor patterns were previously described for action 430 in the process 400 of FIG. 4. These descriptions will not be repeated.

At 555, one or more dielectric layers may be formed on the surface of the piezoelectric plate 542 over the conductor patterns 552. The dielectric layers may include a layer 556 selectively formed over the IDT fingers of shunt resonators. The structure of and techniques for forming the dielectric layers were previously described for action 440 in the process 400 of FIG. 4. These descriptions will not be repeated.

At 560, openings 562 are etched through the piezoelectric plate 542 and the underlying bonding layer 536. The openings 562 may be circular holes or elongated slots or some other shape. As shown in FIG. 5B, the openings 562 are adjacent to the area occupied by the IDT fingers 554. In other embodiments, there may be openings within the area of the IDT fingers. In all cases, the openings 562 are within regions encircled by the lateral etch stops 524, 526.

Referring now to FIG. 5C, at 570, cavities 572 are etched into the substrate 512 using a first liquid or gaseous etchant introduced via the openings 562. The lateral growth of the cavities 572 is constrained by the lateral etch-stops 524, 526, and the shape of the bottoms of the cavities is uncontrolled. The depth of the cavities 572 is limited only by the duration of the etching process. Some lateral growth of the cavities may occur, as shown in FIG. 5C, if the depth of the cavities exceeds the height of the lateral etch-stops 524, 526. The shape of the cavities 572 shown in FIG. 5C is exemplary but not based on simulation or measurement of actual etched cavities.

Depending on the material and thickness of the bonding layer 536, it may be necessary to remove the bonding layer material from the back side 582 of the diaphragms. To this end, a second liquid or gaseous etchant is introduced via the openings 562. If the lateral etch-stops 524, 526 include the same material as the bonding layer 536, removal of the bonding layer material from the back side 582 of the diaphragms may also remove all or part of the lateral etch-stops.

The filter device is then completed at 590. Actions that may occur at 590 include depositing an encapsulation/passivation layer such as $SiO_2$ or $Si_3O_4$ over all or a portion of the device and/or forming bonding pads or solder bumps or other means for making connection between the device and external circuitry if these steps were not performed at 550. Other actions at 590 may include excising individual devices from a wafer containing multiple devices; other packaging steps; and testing. Another action that may occur at 590 is to tune the resonant frequencies of the resonators within the device by adding or removing metal or dielectric material from the front side of the device. After the filter device is completed, the process ends at 595.

Figure 6A:
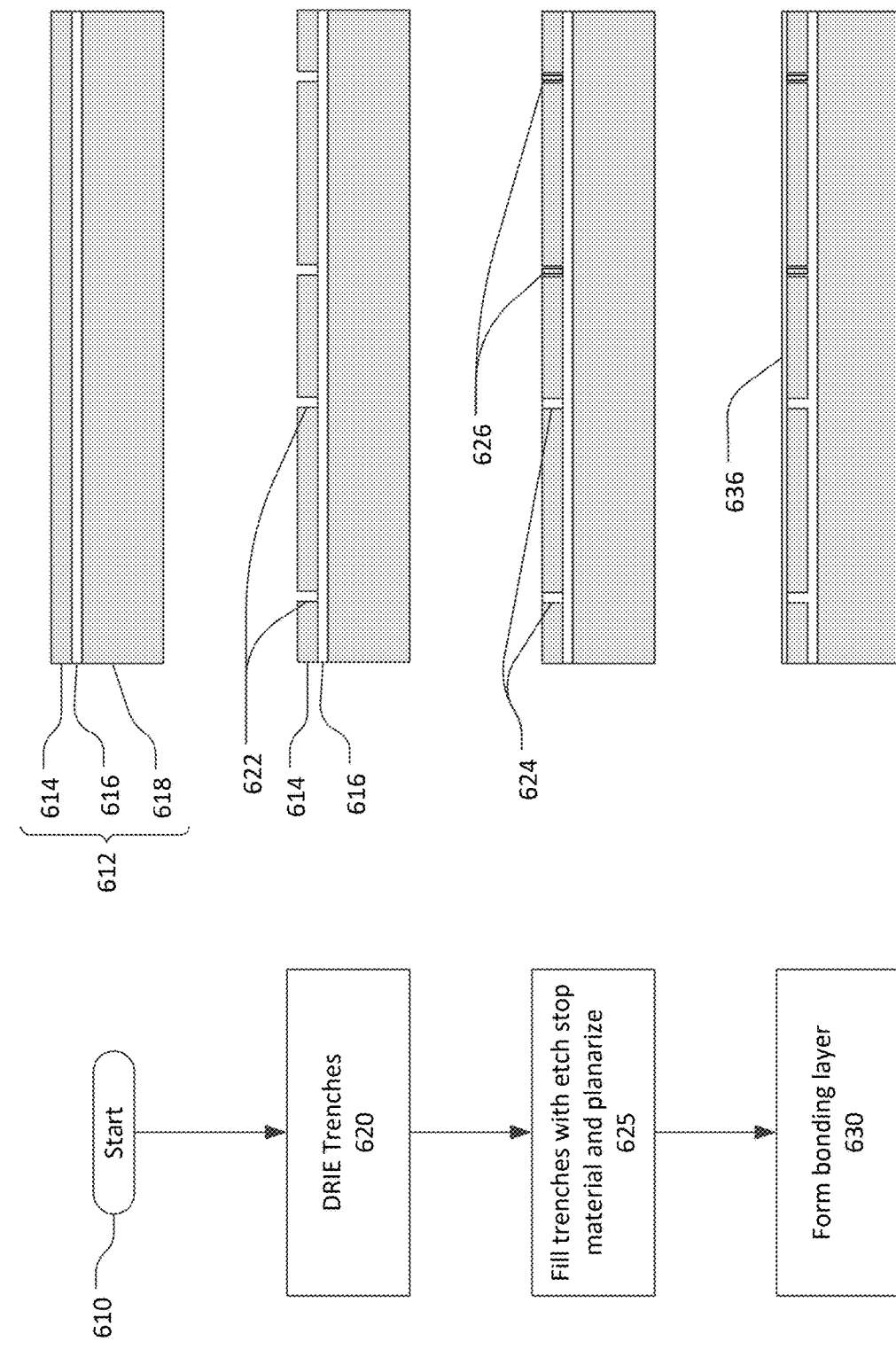
FIG. 6A, FIG. 6B, and FIG. 6C (collectively "FIG. 6") are a flow chart of another process for fabricating an XBAR using a lateral etch stop.
Figure 6B:
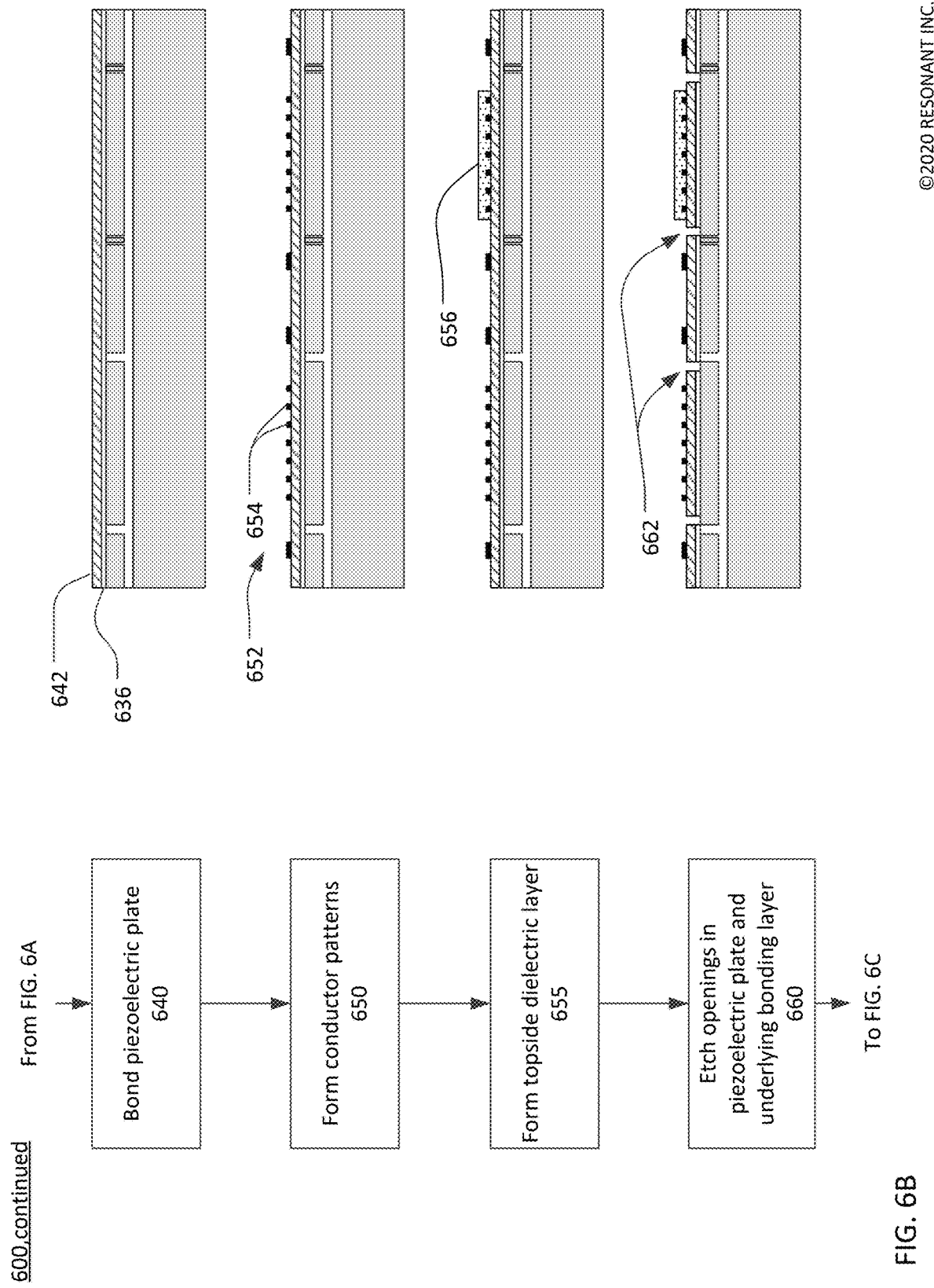
Figure 6C:
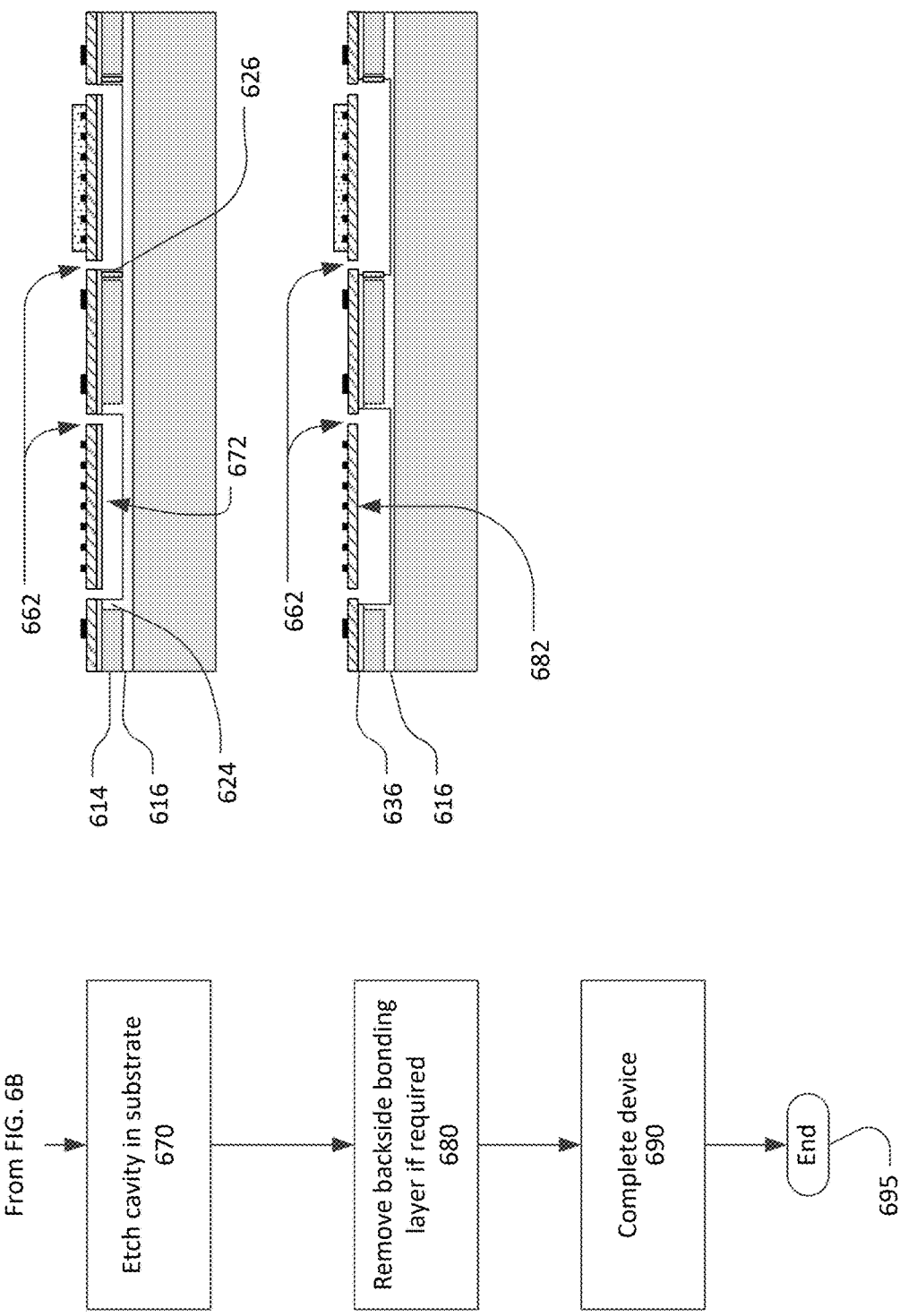

FIG. 6A, FIG. 6B, and FIG. 6C (collectively "FIG. 6") are a simplified flow chart of another process 600 for fabricating an XBAR. The process 600 uses both a lateral etch-stop and a vertical etch-stop (for example, lateral etch-stop 350 and vertical etch-stop 352 in FIG. 3C). To the right of each action in the flow chart is a schematic cross-sectional view representing the end of each action.

The process 600 starts at 610 in FIG. 6A with a substrate 612 and a plate of piezoelectric material. The substrate 612 is a laminate comprising a device layer 614, a buried layer 616, and a handle layer 618. For example, the device layer 614 may be silicon with a thickness between 15 and 100 microns. The buried layer 616 may be a silicon dioxide layer grown on one or both of the handle layer 618 and the device layer 614. The thickness of the buried oxide layer 616 may be about 2 microns. The handle layer 618 may be a silicon wafer having a thickness of about 250 microns to 1000 microns. The device, buried, and handle layers are typically bonded together using a wafer bonding process. Other combinations of material may be used for the device, buried, and handle layers. The buried is an etch-stop material as previously described.

The piezoelectric plate may be mounted on a sacrificial substrate or may be a portion of wafer of piezoelectric material as previously described. The process 600 ends at 695 in FIG. 6C with a completed resonator or filter device. The flow chart of FIG. 6 includes only major process steps. Various conventional process steps (e.g. surface preparation, cleaning, inspection, deposition, photolithography, baking, annealing, monitoring, testing, etc.) may be performed before, between, after, and during the steps shown in FIG. 6.

At 620, trenches 622 are formed in the device layer 614 in the locations where the lateral etch stop is desired. While the trenches 622 are only shown in cross-section in FIG. 5A, it must be understood that each etch-stop trench is a ring completely around the perimeter of what will become a cavity. The trenches 622 may be formed by etching the substrate through a suitable mask such as a photoresist mask or a hard mask. The trenches may be etched into the substrate using a suitable wet or dry etching process. For example, when the substrate is silicon, the trenches may be formed using deep reactive ion etching (DRIE). Other etching processes may be used on other substrate materials.

So long as the process used to etch the trenches 522 does not etch the buried layer 616, the depth of the trenches 622 is determined by the thickness of the device layer 614.

At 625, lateral etch-stops are formed by filling the trenches 622 with one or more etch-stop materials. The etch-stop material or materials may be grown on the substrate and/or deposited onto the substrate using conventional deposition processes such as thermal oxidation, evaporation, sputtering, or chemical vapor deposition. The etch-stop material or materials may be any materials that will function to constrain the lateral growth of the cavity to be etched in the device layer 614. When the device layer 614 is silicon, suitable etch-stop materials include silicon dioxide, silicon nitride, and aluminum oxide.

The lateral etch-stops formed at 620 may be a single material, as shown for lateral etch-stop 624, which may one of the previously described etch-stop materials deposited by a conventional process such as sputtering or chemical vapor deposition. The lateral etch-stops may be two or more materials as shown for lateral etch-stop 626. For example, when the device layer 614 is silicon, a layer of silicon dioxide may first be grown on the surface of the device layer 614 and the interior of the trenches 622. Grown oxide typically has fewer pinholes and other defects than deposited materials. Subsequently, a second material may be deposited over the grown oxide on the surface of the device layer 614 and within the trenches 622. As will be discussed subsequently, there may be some benefit to depositing a material other than silicon dioxide over the grown oxide.

After the trenches 622 are filled with one or more materials to form the lateral etch-stops 624, 626, the surface of the substrate 612 will be uneven and must be planarized. Planarization may be performed by mechanical polishing, by chemo-mechanical polishing, or some other method.

At 630, a bonding layer 636 is formed on the planarized surface of the device layer 614. The bonding layer may silicon dioxide or some material capable of bonding to the piezoelectric material (typically lithium niobate or lithium tantalate) to be used in the XBAR. The bonding layer may be formed by a conventional process such as evaporation, sputtering, chemical vapor deposition or molecular beam epitaxy.

Referring now to FIG. 6B, at 640, a piezoelectric plate 642 is bonded to the bonding layer 636. Techniques for bonding the piezoelectric plate were previously described for action 420 in the process 400 of FIG. 4. The description of those techniques will not be repeated.

At 650, conductor patterns 652 are formed on the surface of the piezoelectric plate 642. The conductor patterns include IDT fingers 654 disposed on portions of the piezoelectric plate 642 where cavities will be formed in the substrate. The structure of and techniques for forming the conductor patterns were previously described for action 430 in the process 400 of FIG. 4. These descriptions will not be repeated.

At 655, one or more dielectric layers may be formed on the surface of the piezoelectric plate 642 over the conductor patterns 652. The dielectric layers may include a layer 656 selectively formed over the IDT fingers of shunt resonators. The structure of and techniques for forming the dielectric layers were previously described for action 440 in the process 400 of FIG. 4. These descriptions will not be repeated.

At 660, openings 662 are etched through the piezoelectric plate 642 and the underlying bonding layer 636. The openings 662 may be circular holes or elongated slots or some other shape. As shown in FIG. 6B, the openings 662 are adjacent to the area occupied by the IDT fingers 654. In other embodiments, there may be openings within the area of the IDT fingers. In all cases, the openings 662 are within regions encircled by the lateral etch stops 624, 626.

Referring now to FIG. 6C, at 670, cavities 672 are etched into the device layer 614 using a first liquid or gaseous etchant introduced via the openings 662. The lateral growth of the cavities 672 is constrained by the lateral etch-stops 624, 626. The depth of the cavities 672 is limited by the buried layer 616, which functions as the vertical etch-stop.

Depending on the material and thickness of the bonding layer 636, it may be necessary to remove the bonding layer material from the back side 682 of the diaphragms. To this end, a second liquid or gaseous etchant is introduced via the openings 662. If the lateral etch-stops 624, 626 include the same material as the bonding layer 636, removal of the bonding layer material from the back side 682 of the diaphragms may also remove all or part of the lateral etch-stops. Similarly, when the bonding layer is silicon dioxide, removal of the bonding layer material from the back side 682 of the diaphragms may also remove all or part of the buried oxide layer 616 beneath the cavities.

The filter device is then completed at 690. Actions that may occur at 690 include depositing an encapsulation/passivation layer such as $SiO_2$ or $Si_3O_4$ over all or a portion of the device and/or forming bonding pads or solder bumps or other means for making connection between the device and external circuitry if these steps were not performed at 650. Other actions at 690 may include excising individual devices from a wafer containing multiple devices; other packaging steps; and testing. Another action that may occur at 690 is to tune the resonant frequencies of the resonators within the device by adding or removing metal or dielectric material from the front side of the device. After the filter device is completed, the process ends at 695.

Figure 7A:
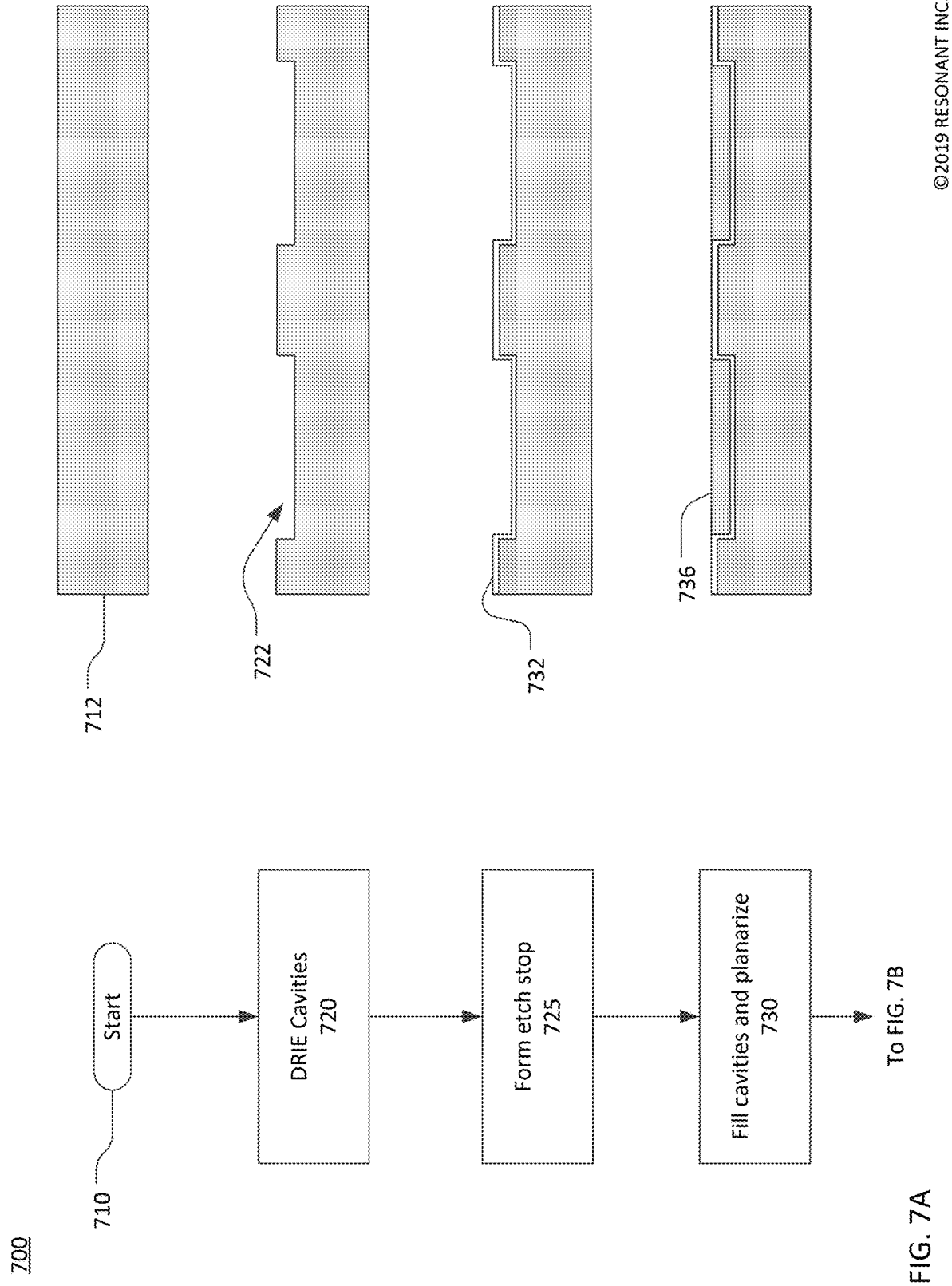
FIG. 7A and FIG. 7B (collectively "FIG. 7") are a flow chart of another process for fabricating an XBAR using a lateral etch stop.
Figure 7B:
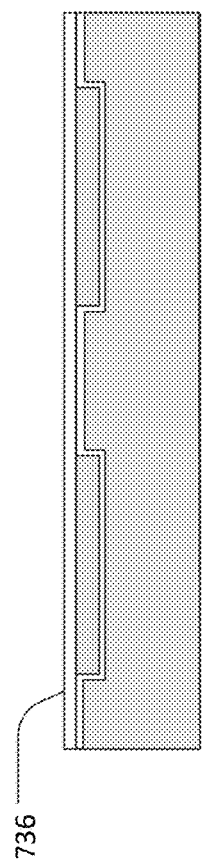
Figure 7B:
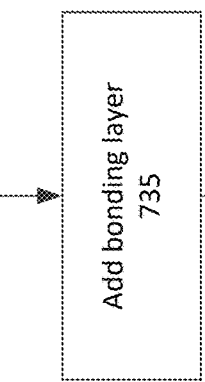

FIG. 7A and FIG. 7B (collectively "FIG. 7") are a simplified flow chart of another process 700 for fabricating an XBAR. The process 700 uses both a lateral etch-stop and a vertical etch-stop (for example, lateral etch-stop 350 and vertical etch-stop 352 in FIG. 3C). To the right of each action in the flow chart is a schematic cross-sectional view representing the end of each action. The later steps of the process 700 are similar to the steps 640-695 of the process 600 of FIG. 6. The description of these steps will not be repeated. Various conventional process steps (e.g. surface preparation, cleaning, inspection, deposition, photolithography, baking, annealing, monitoring, testing, etc.) may be performed before, between, after, and during the steps shown in FIG. 7.

The process 700 starts at 710 in FIG. 7A with a substrate 712 and a plate of piezoelectric material. The substrate 712 may be a silicon wafer or a wafer of another material that allows the formation of deep cavities by etching or some other process. The piezoelectric plate may be mounted on a sacrificial substrate or may be a portion of wafer of piezoelectric material as previously described.

At 720, recesses 722 are formed in the substrate 712 in the locations where the lateral etch stop is desired. While the recesses 722 are only shown in cross-section in FIG. 7A, it must be understood that each recess 722 is a three-dimensional created by removing material from the substrate. Each recess 722 may have a cross-sectional shape (normal to the plane of the drawing) that is a rectangle, a regular or irregular polygon, oval, or some other shape. The recesses 722 may be formed by etching the substrate through a suitable mask such as a photoresist mask or a hard mask. The recesses 722 may be etched into the substrate using a suitable wet or dry etching process. For example, when the substrate is silicon, the recesses may be formed using deep reactive ion etching (DRIE). Other etching processes may be used on other substrate materials.

At 725, lateral and vertical etch-stops 732 are formed by coating the substrate 712, including the bottom and sides of the recesses 722 with one or more etch-stop materials. The etch-stop material or materials may be grown on the substrate and/or deposited onto the substrate using conventional deposition processes such as thermal oxidation, physical vapor deposition, or chemical vapor deposition. The etch-stop material or materials may be any materials that will function to constrain the lateral and vertical growth of the cavity to be formed in the substrate. When the substrate 712 is silicon, suitable etch-stop materials include grown or deposited silicon dioxide, silicon nitride, and aluminum oxide.

At 730, the recesses 722 are filled with a sacrificial material 736. In subsequent process steps, a piezoelectric plate will be bonded to the substrate and the sacrificial material will be removed to form cavities under the piezoelectric plate. The sacrificial material 736 can be any material that can be subsequently be removed by etching, dissolving, or some other process. The etch stop material 722 can be any material that is impervious to the process used to remove the sacrificial material. For example, when the substrate is silicon, the etch-stop material may be silicon dioxide and the sacrificial material may be polysilicon. Other combinations of substrate material, etch-stop material, and sacrificial material may be used.

After the recesses 722 are filled with sacrificial material 736, the surface of the substrate 712 will be uneven and must be planarized. Planarization may be performed by mechanical polishing, by chemo-mechanical polishing, or some other method.

At 730 in FIG. 7B, a bonding layer 736 is formed on the planarized surface of the substrate 712. The bonding layer may silicon dioxide or some material capable of bonding to the piezoelectric material (typically lithium niobate or lithium tantalate) to be used in the XBAR. The bonding layer may be formed by a conventional process such as physical vapor deposition, chemical vapor deposition, or molecular beam epitaxy.

The process 700 then continues at 640 in FIG. 6B. The subsequent steps of the process are as previously described with the exception that, at 670, the cavities are formed by removing the sacrificial material from the recesses in the substrate.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate comprising a device layer having opposed front and back surfaces, a handle layer, and a buried layer laminated between the handle layer and the back surface of the device layer, wherein a cavity open to the front surface is formed in the device layer;
   a lateral etch-stop that defines a perimeter of the cavity, the lateral etch-stop comprising a lateral etch-stop material different from a material of the device layer;
   a single-crystal piezoelectric plate having opposed front and back surfaces, the back surface attached to the front surface of the device layer except for a portion of the piezoelectric plate forming a diaphragm that spans the cavity; and
   an interdigital transducer (IDT) formed on the front surface of the piezoelectric plate such that interleaved fingers of the IDT are disposed on the diaphragm.

2. The device of claim 1, wherein
   the piezoelectric plate and the IDT are configured such that a radio frequency signal applied to the IDT excites a primary shear acoustic mode in the diaphragm.

3. The device of claim 2, wherein the piezoelectric plate is one of lithium niobate and lithium tantalate.

4. The device of claim 1, further comprising:
   a bonding layer disposed between and in contact with the back surface of the piezoelectric plate and the front surface of the device layer.

5. The device of claim 1, wherein
   the cavity extends from the back surface of the piezoelectric plate though the device layer to the buried layer.

6. The device of claim 1, wherein
   the device layer is silicon,
   the buried layer is silicon dioxide, and
   the handle layer is silicon.

7. The device of claim 1, wherein
   the lateral etch-stop material comprises one of silicon oxide, silicon nitride, silicon oxynitride, a metal oxide, a metal nitride a glass, a ceramic, and a polymer material.

8. The device of claim 1, wherein
   the cavity is formed by an etch process; and
   the lateral etch-stop and the buried layer are substantially impervious to the etch process.

9. An acoustic filter device comprising:
   a substrate comprising a device layer having opposed front and back surfaces, a handle layer, and a buried layer laminated between the handle layer and the back surface of the device layer, wherein a plurality of cavities open to the front surface are formed in the device layer;
   a plurality of lateral etch-stops, each lateral etch-stop defining a perimeter of a respective cavity from the plurality of cavities, each lateral etch-stop comprising a lateral etch-stop material different from a material of the device layer;
   a single-crystal piezoelectric plate having opposed front and back surfaces, the back surface attached to the front surface of the substrate except for portions of the piezoelectric plate forming a plurality of diaphragms, each diaphragm spanning a respective cavity from the plurality of cavities; and
   a plurality of interdigital transducers (IDTs) of a plurality of resonators formed on the front surface of the piezoelectric plate such that interleaved fingers of each IDT are disposed on a respective diaphragm from the plurality of diaphragms.

10. The device of claim 9, wherein
    the piezoelectric plate and all of the plurality of IDTs are configured such that radio frequency signals applied to the plurality of IDTs excite primary shear acoustic modes in the respective diaphragms.

11. The device of claim 10, wherein the piezoelectric plate is one of lithium niobate and lithium tantalate.

12. The device of claim 9, further comprising:
    a bonding layer disposed between and in contact with the back surface of the piezoelectric plate and the front surface of the device layer.

13. The device of claim 9, wherein
    each cavity from the plurality of cavities extends from the back surface of the piezoelectric plate though the device layer to the buried layer.

14. The device of claim 9, wherein
    the device layer is silicon,
    the buried layer is silicon dioxide, and
    the handle layer is silicon.

15. The device of claim 9, wherein
    the lateral etch-stop material comprises one of silicon oxide, silicon nitride, silicon oxynitride, a metal oxide, a metal nitride a glass, a ceramic, and a polymer material.

16. The device of claim 9, wherein
    the plurality of cavities are formed by an etch process; and
    the plurality of lateral etch-stops and the buried layer are substantially impervious to the etch process.

17. The device of claim 9, wherein the plurality of resonators includes one or more shunt resonators and one or more series resonators, the device further comprising:
    a dielectric layer selectively formed over the IDTs of shunt resonators to shift a resonance frequency of the shunt resonators relative to a resonance frequency of series resonators.

18. The device of claim 9, further comprising:
    an encapsulation/passivation layer deposited over all or a substantial portion of the device.

* * * * *